(12) United States Patent
Ding et al.

(10) Patent No.: US 9,390,216 B2
(45) Date of Patent: Jul. 12, 2016

(54) SYSTEM AND METHOD FOR OBSTACLE-AVOIDING SIGNAL BUS ROUTING

(71) Applicant: ORACLE INTERNATIONAL CORPORATION, Redwood Shores, CA (US)

(72) Inventors: Duo Ding, Austin, TX (US); Akshay Sharma, Austin, TX (US); Huy Vo, Austin, TX (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 65 days.

(21) Appl. No.: 14/518,206

(22) Filed: Oct. 20, 2014

(65) Prior Publication Data

US 2016/0110490 A1 Apr. 21, 2016

(51) Int. Cl.
*G06F 17/50* (2006.01)
(52) U.S. Cl.
CPC .................. *G06F 17/5077* (2013.01)
(58) Field of Classification Search
CPC .................................................. G06F 17/5077
USPC ......................................................... 716/126
See application file for complete search history.

(56) References Cited

U.S. PATENT DOCUMENTS

| 6,678,874 | B1 * | 1/2004 | Jochym | G06F 17/5077 716/112 |
| 7,949,984 | B2 * | 5/2011 | Tanamoto | G06F 17/5077 716/124 |
| 8,099,701 | B2 | 1/2012 | Huang et al. | |
| 8,356,267 | B2 * | 1/2013 | Agarwal | G06F 17/5077 716/126 |
| 8,531,943 | B2 * | 9/2013 | Olofsson | G06F 15/17381 370/229 |
| 8,627,255 | B2 | 1/2014 | Vedantam et al. | |

* cited by examiner

*Primary Examiner* — Sun Lin
(74) *Attorney, Agent, or Firm* — Kraguljac Law Group, LLC

(57) ABSTRACT

Systems, methods, and other embodiments associated with providing obstacle-avoidance bus routing for an integrated circuit design are described. In one embodiment, a bus routing tool is disclosed that generates a plurality of escape nodes to construct a three-dimensional routing solution graph. The bus routing tool probes a design space of the integrated circuit design to dynamically determine a location of each escape node while avoiding path blockages within the design space. By traversing the three-dimensional routing solution graph from a leaf escape node near a target location within the design space back to a root escape node near a source location within the design space, a candidate routing solution for routing a signal bus from the source location to the target location can be determined.

20 Claims, 17 Drawing Sheets

Multi-Cluster Multi Sink Bus Geometry

US 9,390,216 B2

SYSTEM AND METHOD FOR OBSTACLE-AVOIDING SIGNAL BUS ROUTING

BACKGROUND

One aspect of designing an integrated circuit (IC) is that of routing signal buses from one part of the IC to another part of the IC to electrically connect circuit elements. The routing of a signal bus (i.e., a bus) may involve traversing many layers of the IC. Furthermore, in a congested IC design, there are many elements that can serve as obstacles to routing a bus. Such obstacles have to be avoided when routing the bus from a source location to a destination location of the IC design. As a result, the task of routing a bus for an IC design can be very complex, especially when a bus has dozens or hundreds of bits (i.e., when the bus is a wide bus).

Routing of buses (especially wide buses) is accomplished largely through manual manipulation of the circuit design by a human designer. The human designer may have to go through many iterations of routing a bus, in a trial-and-error manner, before arriving at an acceptable solution that takes into account various bus-routing constraints such as signal timing and delay. This can be very time-consuming. Even when the human designer arrives at an acceptable solution for routing a bus from an operational perspective, the solution may still be sub-optimal from an IC real-estate utilization perspective. That is, the human designer may have wasted valuable space on the IC that could have been used for the subsequent routing of other buses that are to be routed on the IC. However, the human designer may not realize that there is a more optimal solution.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Systems and methods are described herein of a computer system and/or application that provide automated, obstacle-avoidance routing of signal buses for an integrated circuit (IC) design. In one embodiment, a bus routing tool is disclosed that generates a plurality of escape nodes (nodes) to construct a three-dimensional routing solution graph defining a routing solution domain. The bus routing tool automatically probes a design space of the integrated circuit design to dynamically determine a location of each escape node, between a source location and a target location within the design space, while avoiding path blockages within the design space. By automatically back-traversing the three-dimensional routing solution graph from the target location to the source location, a candidate routing solution for routing a signal bus from the source location to the target location may be determined.

In one embodiment, the bus routing tool is configured to construct a routing solution graph (or in another data structure form) by generating a root escape node proximate a source location in a design space of an integrated circuit design and recursively expanding, in a guided or directed manner, toward a target location in the design space to generate additional escape nodes. Once the routing solution graph is constructed, a path may be traversed backwards through the routing solution graph from an escape node near the target location to the root escape node. A candidate routing solution may then be determined, based on the traversed path, for routing a signal bus from the source location to the target location. The bus routing tool ensures that the routing solution maintains routing regularity for all of the bits of the signal bus.

Example embodiments are discussed herein with respect to wide and complex signal buses, for integrated circuit designs, having multi-cluster and multi-terminal structures, for example. Other types of bus configurations are possible as well, in accordance with other embodiments. Furthermore, other embodiments may be implemented as part of any computer application for performing or aiding integrated circuit design.

Figure 1A:
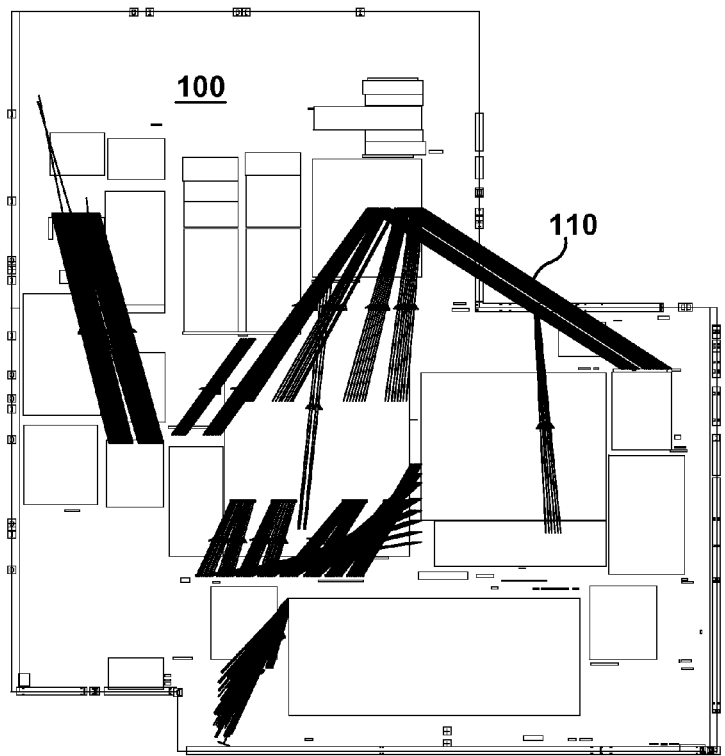
FIG. 1A illustrates one example embodiment of an integrated circuit design showing electrical signal interconnections between circuit elements as un-routed fly-lines.
Figure 1B:
FIG. 1B illustrates another embodiment of the integrated circuit design of FIG. 1A showing the electrical signal interconnections as routed signal buses.

FIG. 1A illustrates one example embodiment of a representation of an integrated circuit design 100 showing electrical signal interconnections between circuit elements as unrouted fly-lines 110. FIG. 1B illustrates another embodiment of the representation of the integrated circuit design 100 of FIG. 1A showing the electrical signal interconnections as routed signal buses 120. The routed signal buses 120 of FIG. 1B are a result of the systems and methods disclosed herein. The routed signal buses 120 include many bits (wires or conductive routes) that are routed together to maintain regularity of the signal buses from source locations to target locations within the integrated circuit design and to achieve route legality (no opens and no shorts).

The more bits making up a signal bus (i.e., a wide bus), the more difficult it can be to maintain regularity. As used herein, the term "regularity" refers to routing all of the bits of a signal bus together in a same manner, as much as possible, from a source location to a target location in the integrated circuit design to preserve the structure of the bus. By maintaining regularity of a routed signal bus, specified signal requirements related to, for example, timing and delay may be met.

For example, maintaining regularity of a routed signal bus may include keeping the bits of the signal bus spatially together as much as possible, avoiding the splitting off of some bits of the signal bus from others. Also, maintaining regularity of a routed signal bus may include keeping the lengths of the routes for each bit of a bus the same, as much as possible, from a source location to a target location. Maintaining regularity may also include having all of the bits of a signal bus making turns together, or transitioning to different metal layers together, as much as possible.

The systems and methods disclosed herein are configured to maintain regularity of a routed signal bus between a source location and a target location. However, perfect regularity of a complex routed signal bus in a congested integrated circuit design is often not possible to achieve. For example, blockages or obstacles may force bits of a signal bus to have to deviate from an ideal path.

Also, some bus configurations are multi-terminal and/or multi-cluster configurations, as discussed later herein. Such multi-terminal and/or multi-cluster configurations may force the separation of bits of a signal bus, thus causing the routed bus to deviate from an ideal path of regularity. However, once the bits of a signal bus are divided for multi-terminal and/or multi-cluster reasons, the bits associated with any one terminal or cluster may be able to maintain substantial regularity.

Figure 2:
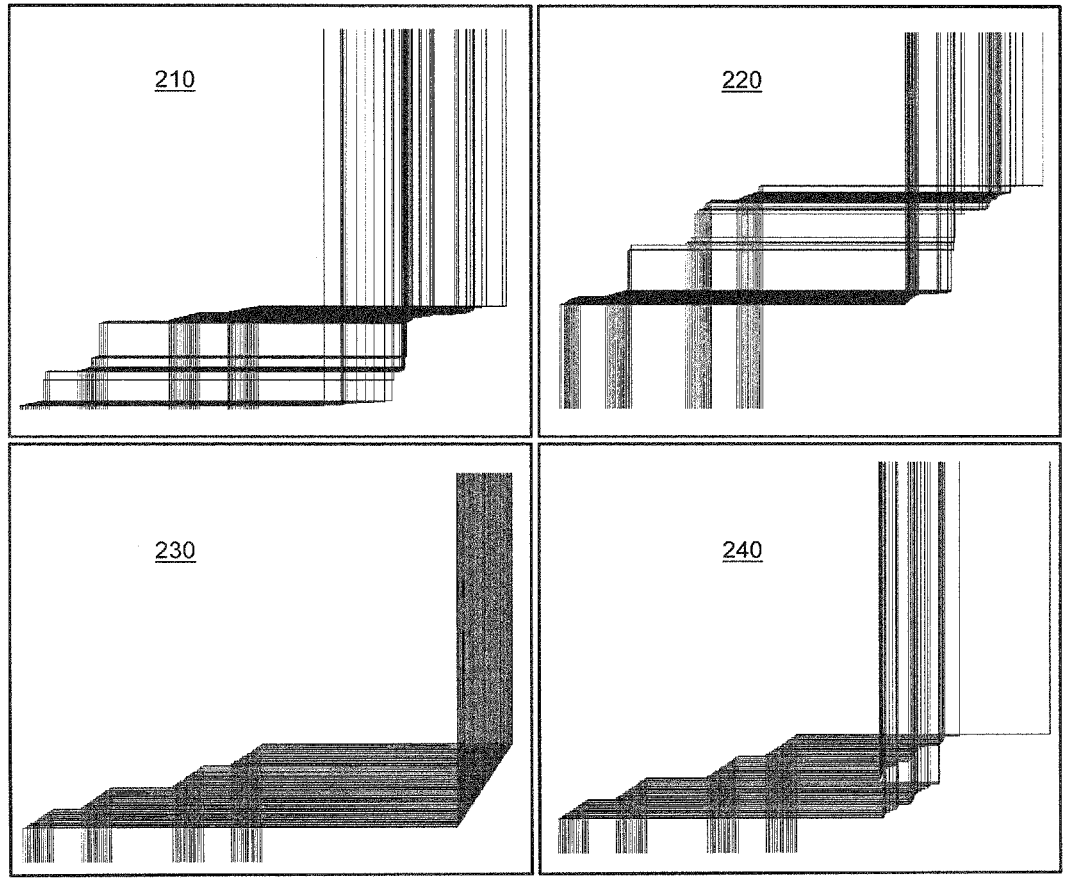
FIG. 2 illustrates several example embodiments of various types of complex three-dimensional routed signal bus structures that can be designed by the systems and methods disclosed herein.

FIG. 2 illustrates several example embodiments of the types of complex three-dimensional routed signal bus structures 210, 220, 230, and 240 that can be achieved by the systems and methods disclosed herein. For example, a complex signal bus may have various combinations of straight sections, L-shaped sections, and S-shaped sections, and may traverse several metal layers of the integrated circuit design. Furthermore, as mentioned above herein, a complex routed signal bus may have multiple terminals and/or multiple clusters. The systems and methods disclosed herein are configured to provide routing solutions for such complex bus structures that are complete and that maintain regularity.

Figure 3:
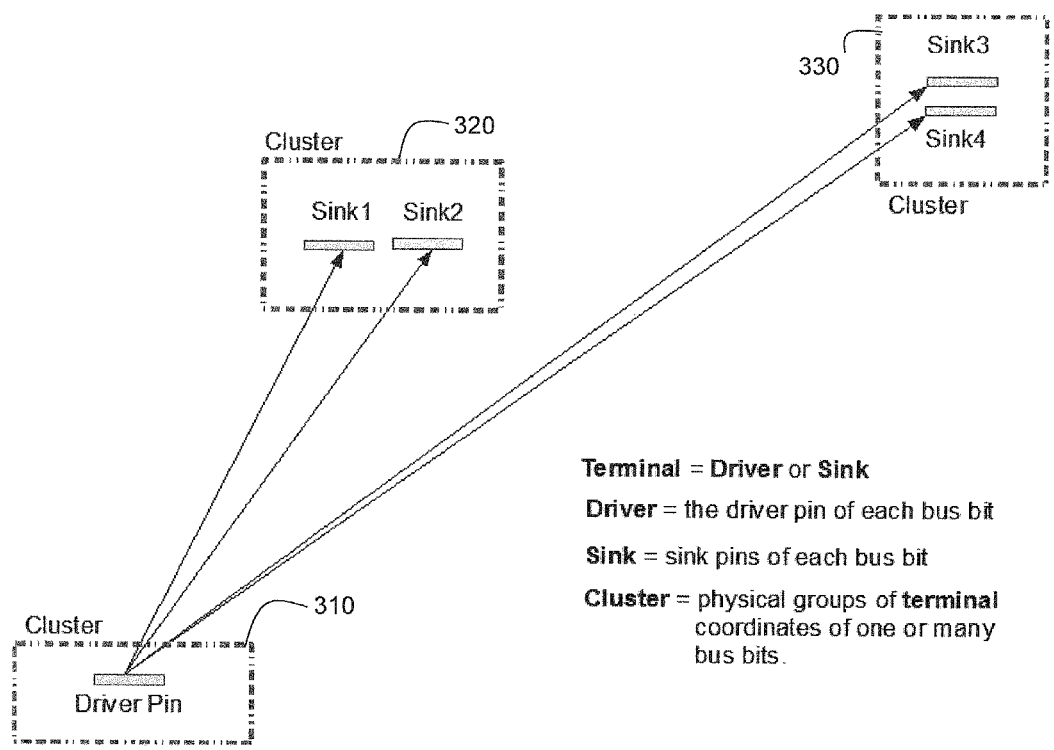
FIG. 3 illustrates the concepts of multi-cluster and multi-terminal signal buses.

FIG. 3 illustrates the concepts of multi-cluster and multi-terminal signal buses. A multi-cluster signal bus is a bus that is associated with sink pins (assigned to one or multiple bits of the bus) that form multiple distinctive groups (e.g., 310, 320, 330) according to the physical location (e.g., x, y, coordinates) of the sink pins. Such a multi-cluster configuration indicates potentially different structures within the same bus. In accordance with an embodiment, the systems and methods disclosed herein decompose such a multi-cluster signal bus into distinct clusters of bits which are then each routed individually. Such decomposition and routing of each cluster of a signal bus makes routing of the entire signal bus more robust in terms of completeness and regularity.

A multi-terminal signal bus is a bus that is associated with driver pins and sink pins that add to more than one terminal count per bit. In this sense, all buses are multi-terminal since any bus is associated with at least one driver pin and one sink pin, resulting in two terminals per bit. However, the term "multi-terminal" usually refers to a bus where the terminal count per bit is greater than two. Similarly, a multi-sink signal bus is a bus having an average sink pin per bit ratio that is greater than one. Again, the systems and methods disclosed herein are configured to provide routing solutions for such complex bus structures that are complete and that maintain regularity.

Figure 4B:
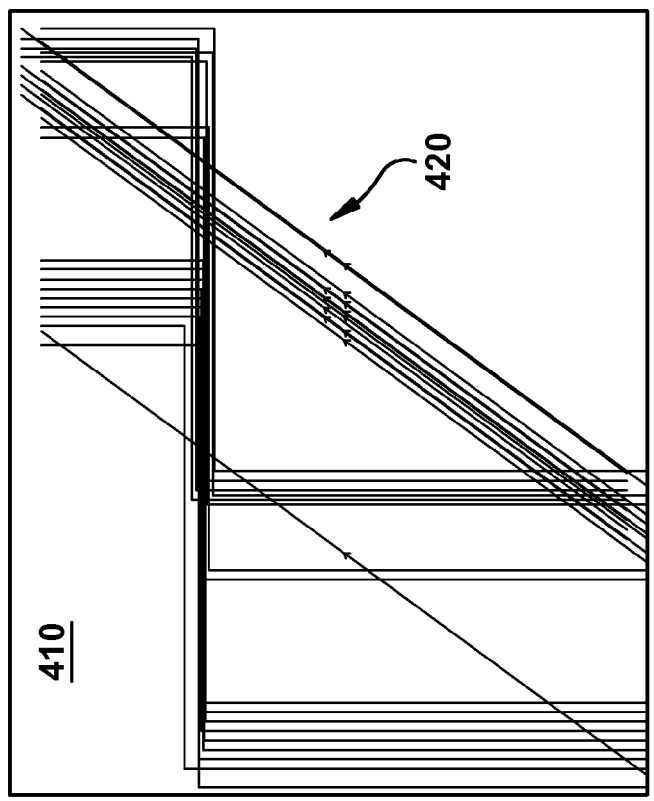
FIG. 4B illustrates an example embodiment of a complex signal bus structure that was routed automatically by the systems and methods disclosed herein.
Figure 4A:
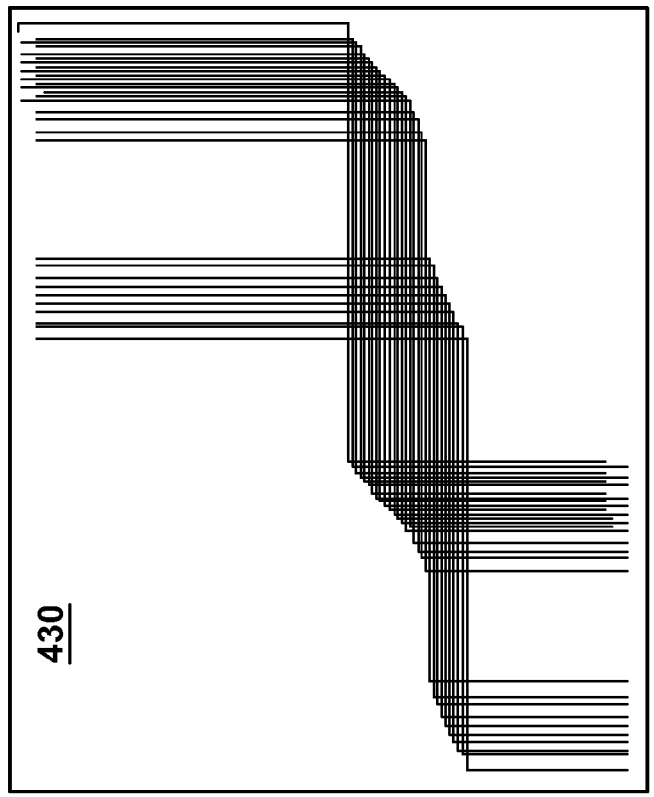
FIG. 4A illustrates an example embodiment of a complex signal bus structure that was attempted to be routed manually by a user.

FIG. 4A illustrates an example embodiment of a complex signal bus structure 410 that was attempted to be routed manually by a user. As can be seen in FIG. 4A, regularity of the bus structure 410 is fairly poor. Furthermore, some of the bits of the bus structure 410 are not successfully routed at all, as indicated by the diagonal fly-lines 420. As a result, the routing is irregular and incomplete. The incomplete routing may be a result of the user not being able to manually find a successful route between a source location and a target location for some of the bits of the bus structure.

FIG. 4B illustrates an example embodiment of a wide and complex signal bus structure 430 that was routed automatically by the systems and methods disclosed herein. As can be seen in FIG. 4B, all of the bits of the bus structure 430 are successfully routed (no fly-lines remain). The routed signal bus structure 430 also maintains regularity of the signal bus and accounts for multi-cluster and multi-terminal conditions. As a result, the likelihood of completely routing all bits of a wide and complex signal bus structure, while maintaining regularity, is much higher with the automated systems and methods disclosed herein compared to that of largely manual approaches.

Figure 5:
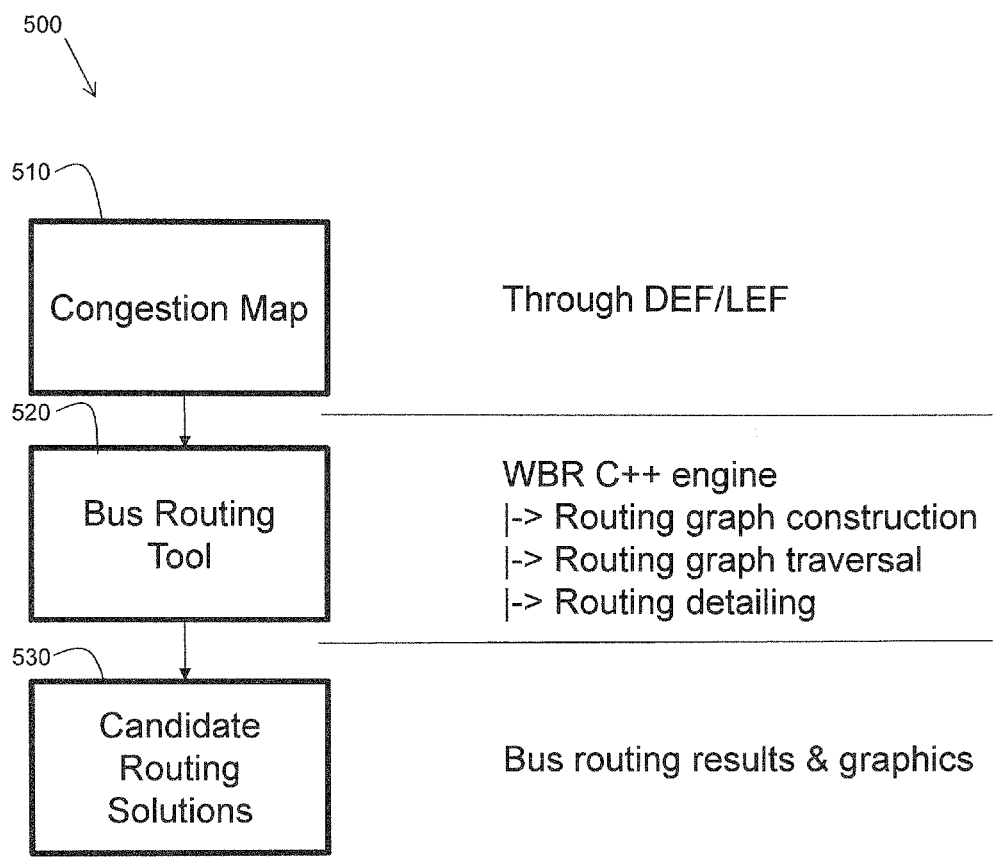
FIG. 5 illustrates one embodiment of a computer-implemented solution flow showing how a bus routing tool is used to determine candidate routing solutions for routing a signal bus in a design space of an integrated circuit design representing an integrated circuit.

FIG. 5 illustrates one embodiment of a computer-implemented solution flow 500 showing how a bus routing tool 520 is used to determine candidate routing solutions 530 for routing a signal bus in a design space of an integrated circuit design representing an integrated circuit. Initially, a congestion map 510 is read by the bus routing tool 520. The congestion map 510 may be in, for example, a design exchange format (DEF) and/or a library exchange format (LEF). The congestion map 510 defines blockages or obstacles within the design space of an integrated circuit design due to, for example, the previous placement of circuit elements, reserved spaces, and any previously routed buses within the design space. Routing of signal buses within the design space by the bus routing tool 520 takes into account the blockages and obstacles.

In one embodiment, the bus routing tool 520 applies a graph-based method to determine candidate routing solutions 530 for routing a bus from a source location to a target location within the design space of the integrated circuit design. First, the graph-based method dynamically constructs a three-dimensional graph of escape nodes defining a routing solution domain between the source location and the target location that takes into account the blockages and obstacles.

An escape node (or just "node") as used herein is a potential array of vias, connecting bus routes through different layers, thus allowing three-dimensional bus routing techniques to be employed. In one embodiment, an escape node is a construct, created by the bus routing tool 520, within the design space having a defined center location (e.g., a possible via location) along with other design space properties such as, for example, route width and available tracks, layers, and interleaving number. A reference to a parent escape node is also provided for child escape nodes. Other properties of an escape node may include costs associated with routing such as, for example, total vias/turns per bit and total wire length. In accordance with one embodiment, the locations of the escape nodes in the graph are not restricted by any grid pattern or any pre-set distances between nodes. In one embodiment, an escape node is a node that refers to a possible location where routes might "escape" from a current shooting line and start in a new direction to avoid running into dead-ends or obstacles.

The graph-based method then performs a graph traversal process where a path (or paths) of escape nodes is traversed through the three-dimensional graph from the target location back to the source location. The path (or paths) of escape nodes define a candidate routing solution (or solutions) 530 for routing the signal bus between the source location and the target location. Detailed routing may then be performed to finalize certain specifics related to bit grouping, track selection, and pin connection of the candidate routing solutions.

In one embodiment, candidate routing solutions 530 may be exported to data structures that are, for example, external to the bus routing tool 520. The exported candidate routing solutions 530 may be in a form that can be input to or read by other computerized tools, allowing visualization and fine tuning of the bus routes by a user, for example.

By the computer-implemented solution flow of FIG. 5 described above herein, candidate routing solutions can be determined that are not restricted to any grid pattern or pre-set distances between nodes, providing more flexibility in determining candidate routing solutions. As a result, candidate routing solutions of higher quality (i.e., better candidate routing solutions) can be determined, and more candidate routing solutions may be found as well, beyond that of what can be accomplished with manual methods or methods that are restricted to following a pre-defined grid pattern.

Figure 6:
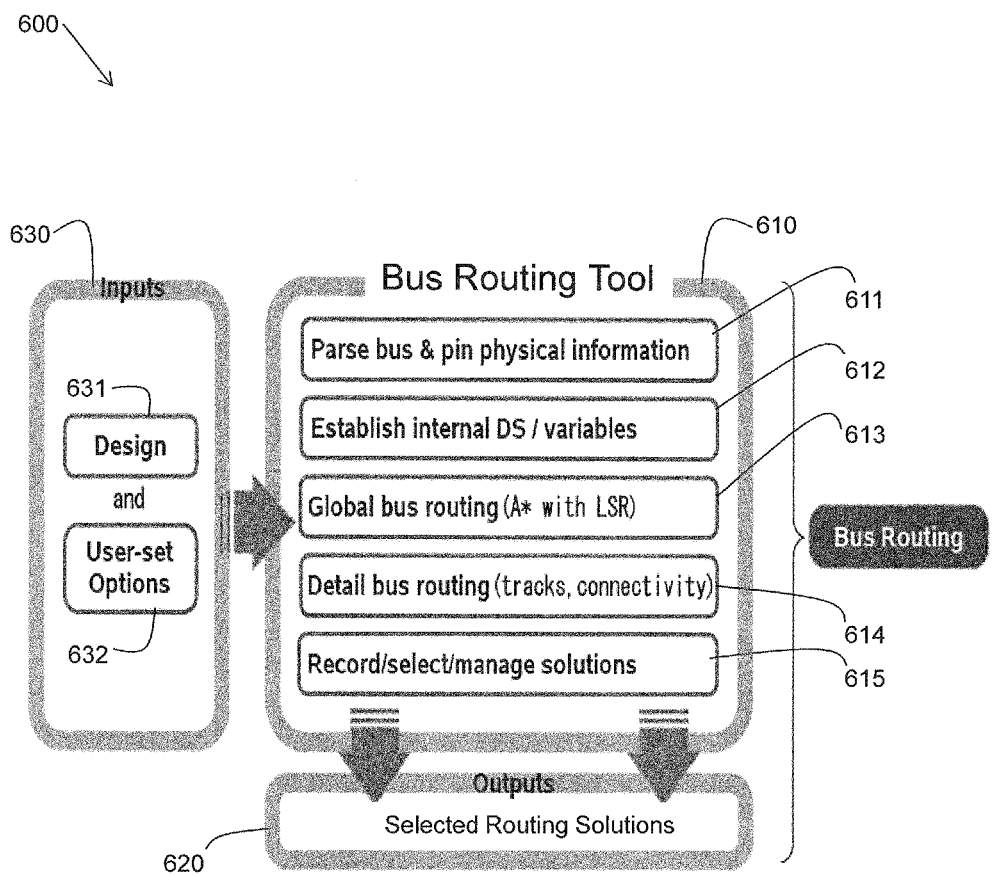
FIG. 6 illustrates another embodiment of a computer-implemented solution flow showing how a bus routing tool is used to determine candidate routing solutions for routing a signal bus in a design space of an integrated circuit design representing an integrated circuit.

FIG. 6 illustrates another embodiment of a computer-implemented solution flow 600 showing how a bus routing tool 610 is used to determine candidate routing solutions 620 for routing a signal bus in a design space of an integrated circuit design representing an integrated circuit. In accordance with one embodiment, the bus routing tool is configured to read user input information 630 which include design data 631 of the integrated circuit design (e.g., a congestion map and a net list) and user-set options 632 (e.g., circuit design options that are set or defined by the user).

In one embodiment, the design data 631 includes congestion map data defining potential path blockages within the design space of the integrated circuit design due to obstacles. Again, the blockages/obstacles may be due to, for example, the previous placement of circuit elements, reserved spaces, and any previously routed buses within the design space. The design data 631 also includes net list data defining electrical connections that are to be completed between source locations and target locations by signal buses. The source locations and target locations may correspond to sets of driver pins and sink pins that are associated with various circuit elements placed within the design space.

The user-set options 632 may include user priority criteria defining user preferences with respect to how to route signal buses. For example, for any particular signal bus to be routed, the user may specify that candidate routing solutions that optimize timing requirements take priority, or candidate routing solutions that minimize a number of turns taken by the bus take priority. Other user priority criteria are possible as well, in accordance with other embodiments. For example, the user may specify that candidate routing solutions that use the lowest metal layers of the integrated circuit design take priority.

Other user-set options may include wire length limits, and guiding points defined by the user which indicate to the bus routing tool 610 that the user prefers that a signal bus be routed in a general manner between the source location and the target location (e.g., straight, then left, then up, then right). Furthermore, other user-set options may define the order in which different signal buses are to be routed within the design space. For example, a signal bus having critical timing requirements may be routed before a signal bus having timing requirements that are less critical.

In one embodiment, the bus routing tool 610 performs various functions which include bus parsing 611, establishment of internal data structures and variables 612, global bus routing 613, detail bus routing 614, and solution management 615. The bus routing tool 610 applies the graph-based methods described herein as part of global bus routing 613, in accordance with one embodiment.

During bus parsing 611, complex bus structures are decomposed into simpler sections, pin clusters are computed, and bus bits are sorted based on pin access direction. During the establishment of internal data structures and variables 612, user-set options input to the bus routing tool 610 are internally established, blockage shapes and available track segments are indexed, and graph/tree data structures to be used by global bus routing 613 are established.

In one embodiment, global bus routing 613 performs the construction of a three-dimensional routing solution of escape nodes for a signal bus (or a decomposed section of a signal bus) via an anchor-based street and traffic aware routing (A-star) technique assisted by a line search routing (LSR) technique. The A-star technique is a guided routing technique that steers graph construction of escape nodes toward the target location for the signal bus to avoid undesirable detours. The LSR technique assists the A-star technique by taking into account access to driver pin banks and sink pin banks to help define which direction to come into a pin. In one embodiment, the three-dimensional routing solution is generated using a data structure of values (e.g., a solution graph or other circuit design structure).

As part of graph construction during global bus routing 613, routing directions may be prioritized via a cost function. The cost function applies penalties to encourage certain routing moves. Every time a move is made from one escape node to another, a certain cost is accrued or paid. Parameters that go into determining a cost may include wire length, number of detours, effects on timing, total vias/turns per bit, and adherence to design rules and schematics. Both the A-star technique and the LSR technique take into account blockages and obstacles within the design space. No grid patterns are followed. Instead, escape nodes are dynamically generated by recursively expanding toward the target location.

Global candidate routing solutions for a signal bus are then determined by global bus routing 613 performing back-traversal through the three-dimensional routing solution from a leaf escape node proximate the target location to a root escape node proximate the source location. In one embodiment, the performance of back-traversal includes applying shortest path algorithms to the routing solution. A single global candidate routing solution defines a single path of escape nodes between the root escape node and the leaf escape node. Global candidate routing solutions may be sorted and prioritized (e.g., based on user-set options) as part of global bus routing 613. Desirable solutions may then be forwarded to detail bus routing 614.

In one embodiment, the bus routing tool 610 is aware of blockages and obstacles during both global bus routing 613 and detail bus routing 614. During detail bus routing 614, individual bits of a candidate routing solution for a signal bus, from global bus routing 613, are accurately routed by aligning the individual bits to tracks, driver pins, and sink pins in the design space to achieve connectivity. In one embodiment, a greedy algorithm is employed to perform the detailed aligning.

During solution management 615, detailed solutions for various signal buses may be recorded within the bus routing tool 610 and selected. Selecting a detailed solution for a signal bus may be based on criteria such as, for example, resultant regularity, friendliness of pin-access, completeness (all bits routed), results of design rule checking, and results of layout vs. schematic comparisons. Design rule checking determines whether a physical layout of an integrated circuit design satisfies a set of recommended parameters called design rules. Layout vs. schematic comparison determines whether a particular integrated circuit design corresponds to the original schematic or circuit diagram of the design. The selected routing solutions may be exported from the bus routing tool 610 as outputs 620. The exported outputs 620 may be in a form that can be input to or read by other computerized tools, allowing visualization and fine tuning of the bus routes by a user, for example.

By the computer-implemented solution flow of FIG. 6 described above herein, candidate routing solutions can be determined that are not restricted to any grid pattern or pre-set distances between nodes, providing more flexibility in determining candidate routing solutions. As a result, candidate routing solutions of higher quality (i.e., better candidate routing solutions) can be determined, and more candidate routing solutions may be found as well, beyond that of what can be accomplished with manual methods or methods that are restricted to following a pre-defined grid pattern, for example.

Figure 7:
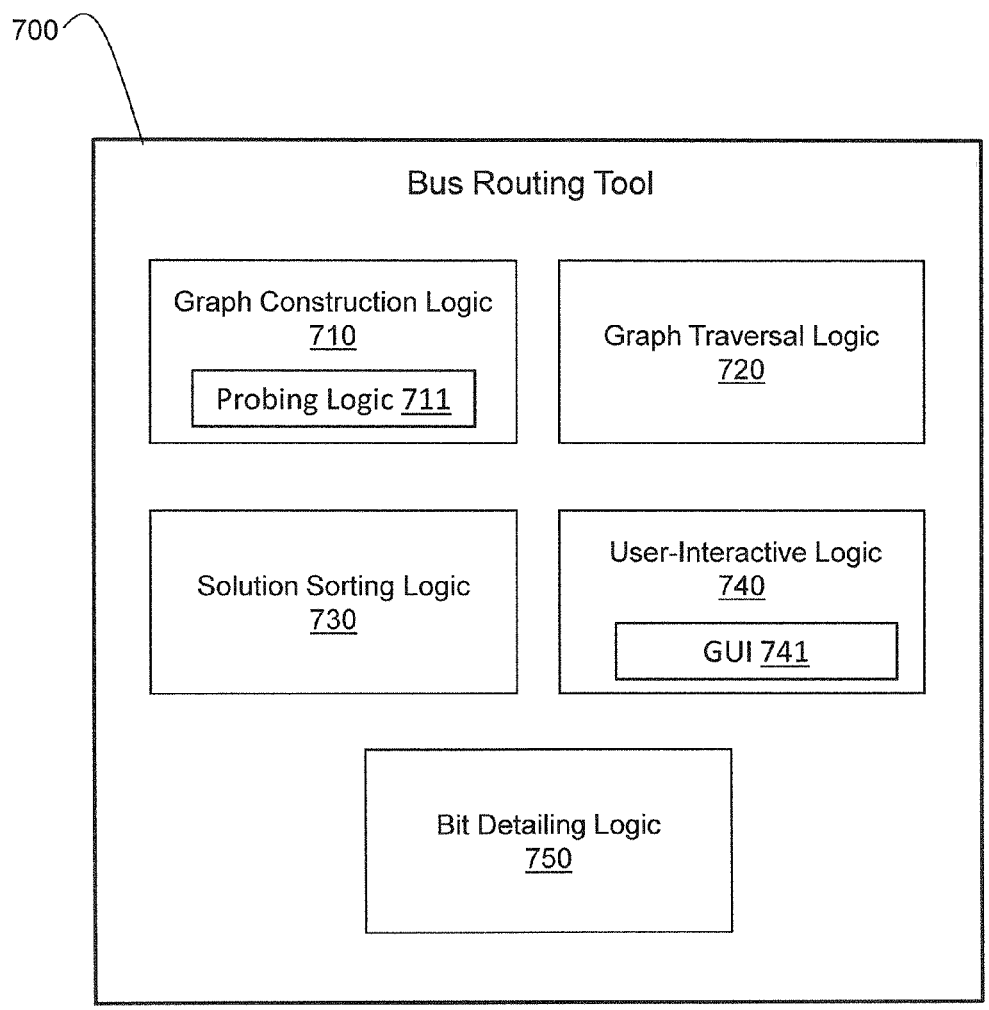
FIG. 7 illustrates one embodiment of a bus routing tool configured to automatically route signal buses within a design space of an integrated circuit design.

FIG. 7 illustrates one embodiment of a bus routing tool 700 configured to automatically route signal buses within a design space of an integrated circuit design. In one embodiment, the bus routing tool 700 is implemented on a computing device and includes a plurality of logics for implementing various functional aspects of the bus routing tool 700. The bus routing tool 700 includes graph construction logic 710, graph traversal logic 720, solution sorting logic 730, user-interactive logic 740, and bit detailing logic 750. In one embodiment, the bus routing tool 700 is an executable algorithm configured to perform the functions of the logics and is stored in a non-transitory medium. The bus routing tool 700 may be implemented on a computing device of a computer system as discussed later herein (e.g., as software instructions executed by a processor of the computing device).

The graph-construction logic 710 is configured to construct a three-dimensional routing solution graph. In one embodiment, the routing solution graph may be in the form of any type of data structure that can represent the circuit components of the solution. The resultant routing solution graph has a plurality of escape nodes defining a routing solution domain between a source location and a target location in a design space of an integrated circuit design. The routing solution domain contains all possible routing solutions for routing a signal bus between the source location and the target location.

The graph-construction logic 710 constructs the routing solution graph by generating a root escape node proximate the source location, and by recursively expanding toward the target location from the root escape node to generate additional escape nodes. The graph construction logic 710 includes probing logic 711 configured to probe the design space in a guided or directed manner to dynamically determine a location (placement) of each escape node that avoids blockages within the design space.

In one embodiment, the graph construction logic 710 is configured to construct the three-dimensional routing solution graph automatically, without user intervention. For example, in one embodiment, the graph construction logic 710 is implemented as a part of global bus routing 613 and uses an enhanced A-star technique assisted by a LSR technique to probe the design space and construct the routing solution graph.

The graph traversal logic 720 is configured to traverse at least one path of escape nodes through the three-dimensional routing solution graph from at least one escape node proximate the target location back to the root escape node. In one embodiment, the graph traversal logic 720 applies shortest path algorithms to the routing solution graph to back-traverse from the target location to the source location. A single candidate routing solution defines a single path of escape nodes between the root escape node and the escape node proximate the target location. In accordance with one embodiment, the graph traversal logic 720 is implemented as a part of global bus routing 613.

The solution sorting logic 730 is configured to sort multiple candidate routing solutions for routing a signal bus, as output by the graph traversal logic 720, based on user-set priority criteria or other user-set limitations as previously discussed herein. For example, the user may specify that candidate routing solutions that use the highest metal layers of the integrated circuit design take priority because the timing of the signal bus to be routed is critical. In accordance with one embodiment, the solution sorting logic 730 is implemented as a part of global bus routing 613.

The user-interactive logic 740 is configured to receive user input information and select one candidate routing solution, based on the user input information, from multiple candidate routing solutions output by the graph traversal logic 720 and sorted by the solution sorting logic 730. Such user selection of a candidate routing solution may be performed to select a global candidate routing solution that is to be forwarded to detail bus routing 614 (see FIG. 6), in accordance with one embodiment. For example, in one embodiment, the user-interactive logic 740 provides a graphical user interface (GUI) 741 for the user to interact with to facilitate inputting user information into the bus routing tool 700. In accordance with one embodiment, the user-interactive logic 740 is implemented as a part of global bus routing 613.

The bit detailing logic 750 is configured to take the selected candidate global bus routing solution and calculate track accurate assignments of routes onto tracks and connectivity of bits onto routes. The bit detailing logic 750 takes into consideration physical information of bus structures related to, for example, pin locations, pin groups and clusters, and far and near sinks. Such physical information is taken into consideration for the purposes of automatic splitting, spreading, interleaving and grouping of bits of the signal bus according to bus structure requirements and design blockage requirements at both a coarse scale (e.g., above 100 um) and a fine scale (e.g., below 100 um). In accordance with one embodiment, the bit detailing logic 750 is implemented as a part of detail bus routing 614.

In this manner, the bus routing tool 700 can determine candidate routing solutions for routing a signal bus in an integrated circuit design. In accordance with one embodiment, the bus routing tool 700 is fully, or at least highly, automated such that little or no user interaction is performed to determine a bus routing solution.

In accordance with another embodiment, the bus routing tool 700 is configured to provide additional interactive features via the user-interactive logic 740. In such an embodiment, full-custom or semi-custom bus routing may be selected by the user to leverage user guidance and custom design expertise. In this manner, a proper and intelligent combination of user-guidance and bus routing automation may be selected and used.

For example, a user may select a percentage or level of bus routing automation via the user-interactive logic 740. A selection of "high" may provide almost totally automated bus routing. A selection of "low" may provide minimal automation, allowing the user to make the majority of global routing decisions. A selection of "medium" may provide a balanced combination of automated and user-interactive bus routing.

In accordance with another embodiment, a sequence of guiding points can be provided to the bus routing tool 700 as user inputs via the user-interactive logic 740. The bus routing tool 700 can use the guiding points as much as possible until the guide deviates away from the route destination by greater than a defined tolerance.

Figure 8:
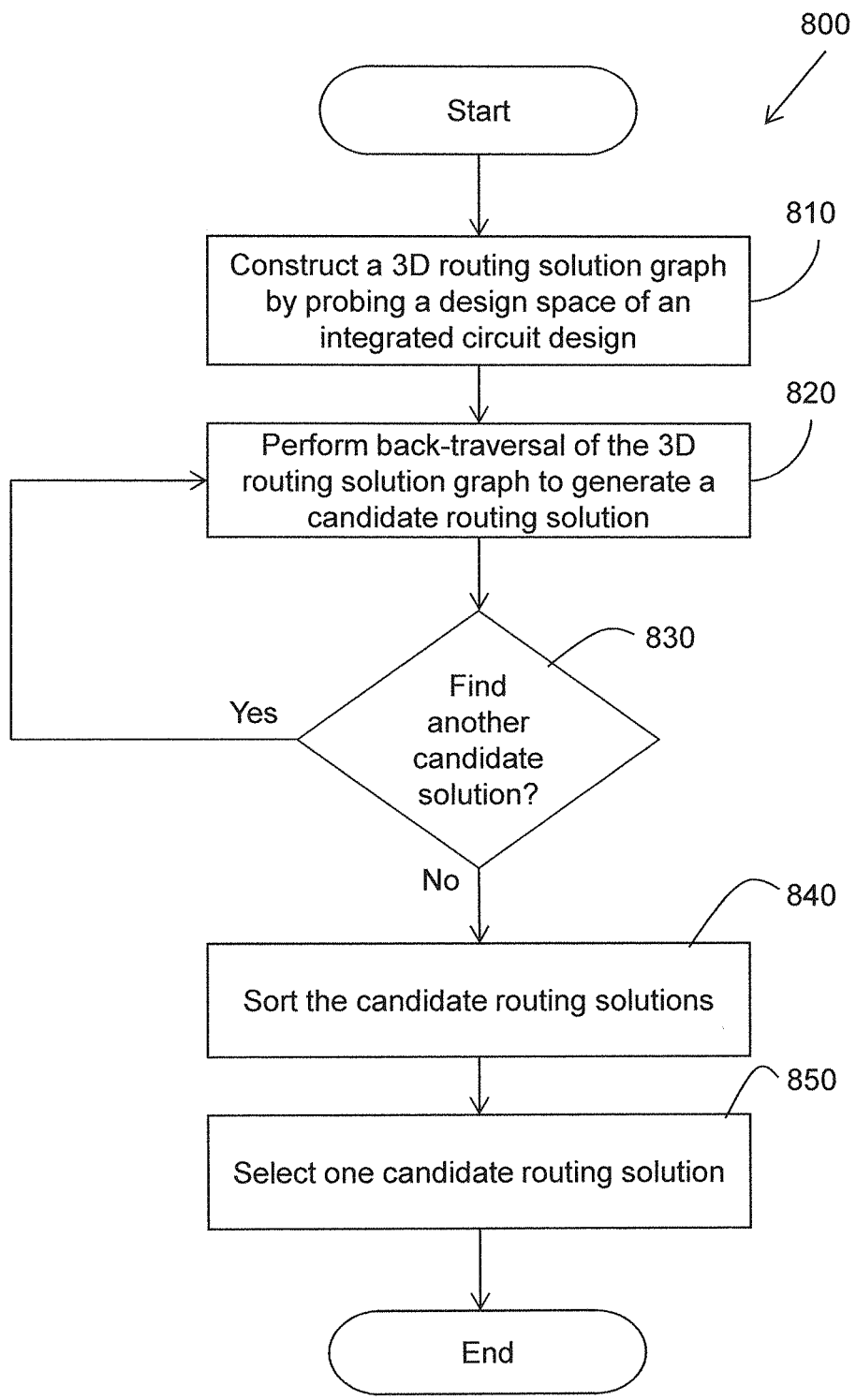
FIG. 8 illustrates one embodiment of a method to determine a bus routing solution for a signal bus implemented to be performed by the bus routing tool of FIG. 7.

FIG. 8 illustrates one embodiment of a method 800 to determine a bus routing solution for a signal bus implemented to be performed by the bus routing tool 700 of FIG. 7. Method 800 is implemented to be performed by the bus routing tool 700 of FIG. 7, or by a computing device configured with an algorithm of method 800. Method 800 will be described from the perspective that inputs to the bus routing tool 700 (e.g., integrated circuit design details such as congestion map data, net list data, and user-set options) have already been created and input to the tool 700.

Upon initiating method 800, at block 810, the bus routing tool 700 constructs a three-dimensional routing solution graph by probing a design space of an integrated circuit design via the graph construction logic 710. At block 820, the bus routing tool 700 performs back-traversal of the routing solution graph to generate a candidate routing solution via the graph traversal logic 720.

At block 830, a decision is made by the bus routing tool 700 as to whether or not to attempt to find another candidate routing solution via the graph traversal logic 720. When the answer at block 830 is yes, then the method 800 reverts back to block 820. Multiple candidate routing solutions may be determined in this manner. When the answer at block 830 is no, then the method proceeds to block 840 where the bus routing tool 700 sorts the candidate routing solutions via the solution sorting logic 730. At block 850, one candidate routing solution is selected, based on user input, via the user-interactive logic 740 of the bus routing tool 700.

Figure 9:
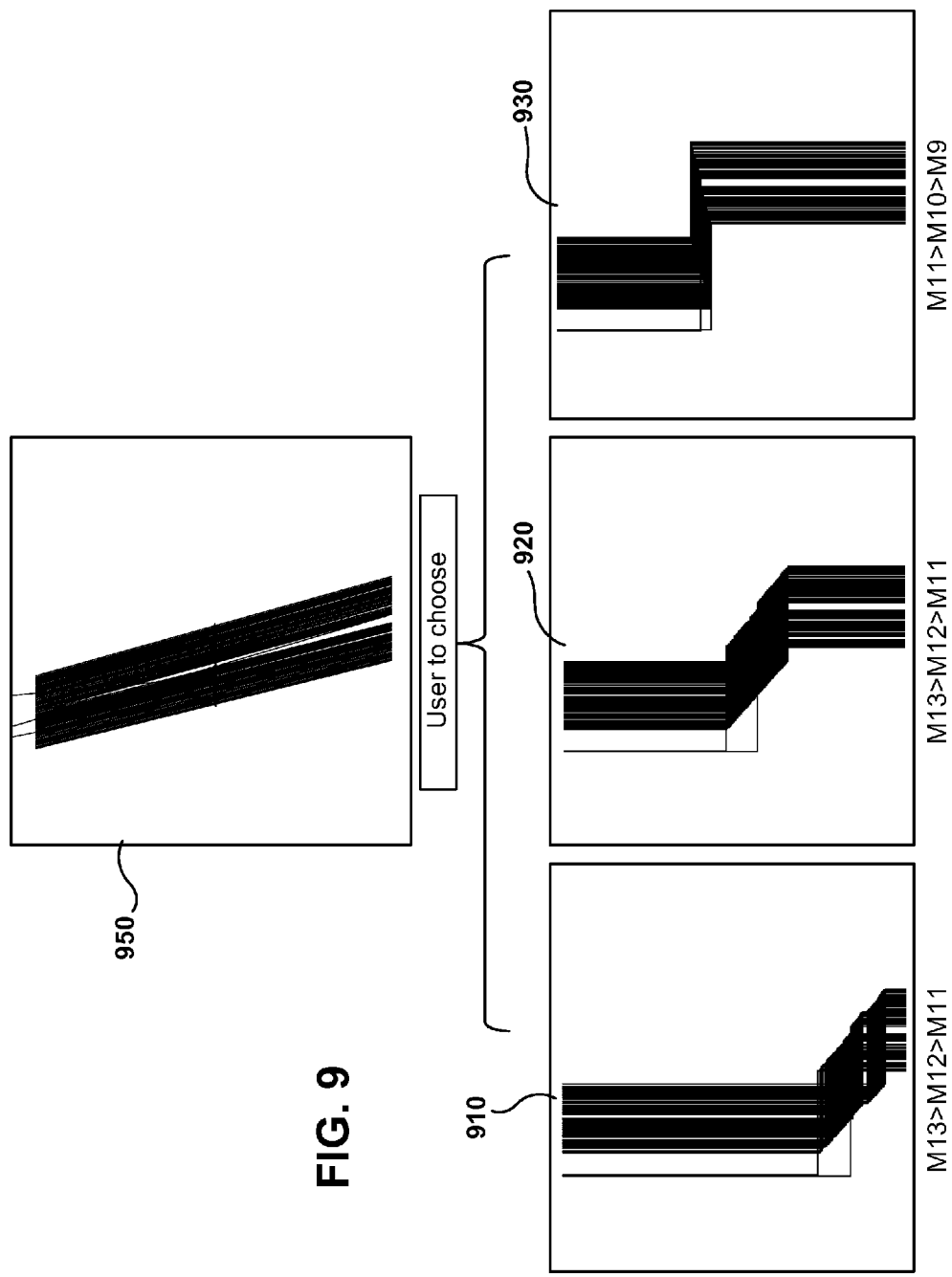
FIG. 9 illustrates one embodiment of multiple sorted candidate routing solutions generated for a signal bus of an integrated circuit design by the bus routing tool of FIG. 7 implementing the method of FIG. 8.

For example, FIG. 9 illustrates one embodiment of multiple sorted candidate routing solutions generated for a signal bus of an integrated circuit design by the bus routing tool 700 FIG. 7 implementing the method 800 of FIG. 8. Referring to FIG. 9, three candidate routing solutions 910, 920, and 930 are shown. Each of the candidate routing solutions 910, 920, and 930 represent a different configuration of a resultant signal bus which each complete the electrical interconnections defined by the fly-lines 940 of the illustrated integrated circuit design 950.

The three candidate routing solutions 910, 920, and 930 are sorted based on the priority of making use of the highest metal layers within the design space of the integrated circuit design 950 due to critical timing constraints. Candidate routing solution 910 is ranked as being first and routes the signal bus along metal layers M13, M12, and M11. Candidate routing solution 920 is ranked as being second and also routes the signal bus along metal layers M13, M12, and M11. Candidate routing solution 930 is ranked as being third and routes the signal bus along metal layers M11, M10, and M9.

In accordance with one embodiment, a user may select one of the candidate routing solutions via the user-interactive logic 740 of the bus routing tool 700. For example, a user may view a graphical representation of each of the candidate routing solutions 910, 920, and 930, along with other associated displayed information, via the GUI 741 and select candidate routing solution 920 to proceed to detail bus routing. Even though candidate routing solution 910 is ranked higher by the solution sorting logic 730, the user may have been persuaded to select candidate routing solution 920 because it appears to be routed in a general manner between the source location and the target location that is preferred by the user while making use of the same metal layers as candidate routing solution 910.

In accordance with one embodiment, if a user is not satisfied with the routing options presented, the user may command the method 800 to be performed again (via the GUI 741) by the bus routing tool 700, resulting in a new set of routing options from which to make a selection. In this manner, by the method 800 of FIG. 8, global bus routing solutions may be determined which give a user a set of options from which to make a choice, before proceeding further to more detailed routing solutions.

Figure 10:
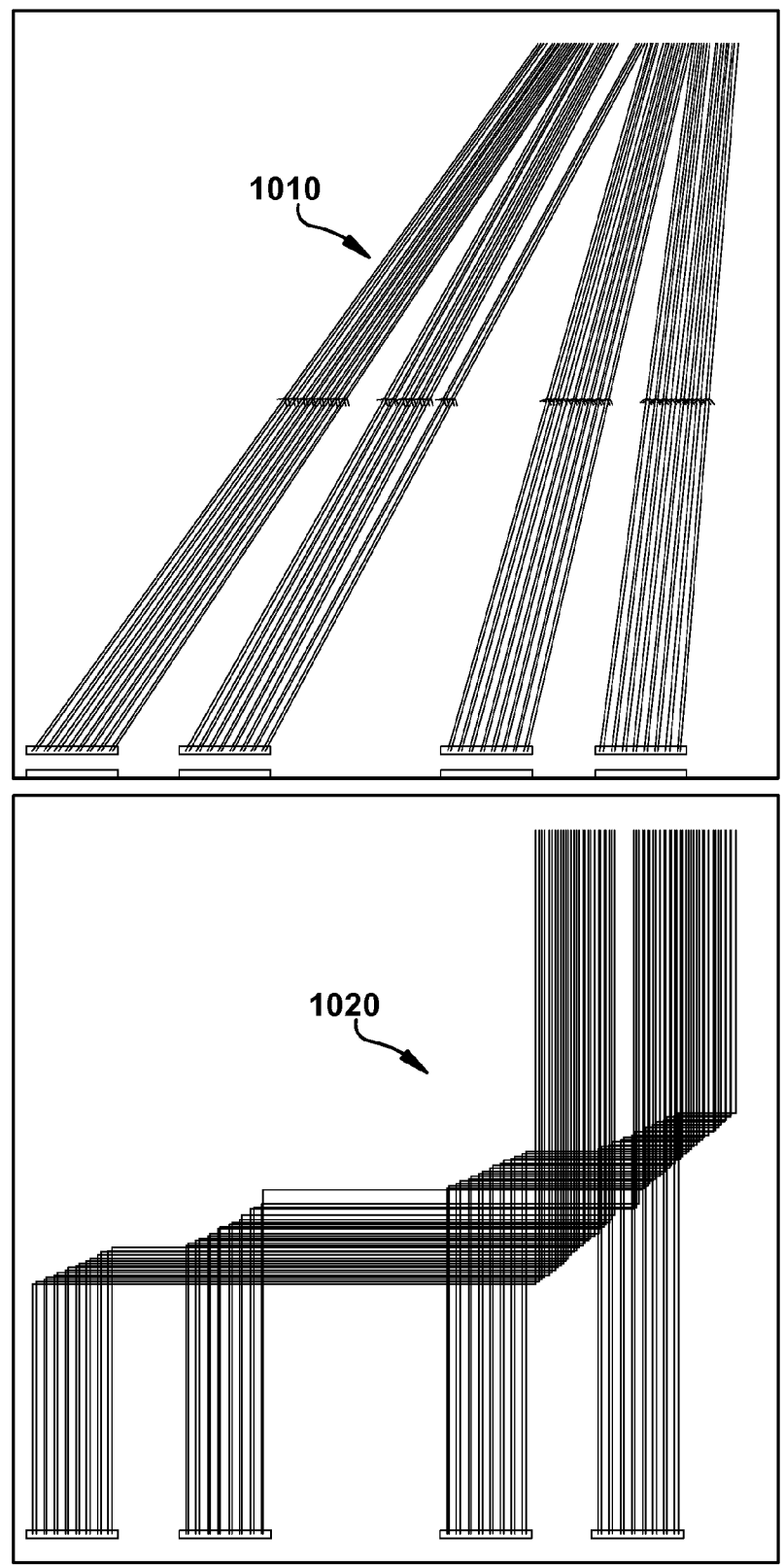
FIG. 10 illustrates one example embodiment of a congested integrated circuit design having a multi-cluster geometry with one driver configured to drive four targets via one signal bus.

FIG. 10 illustrates one example embodiment of a congested integrated circuit design having a multi-cluster geometry with one driver configured to drive four targets via one signal bus. The bus routing tool, as disclosed herein, is configured to take the circuit interconnections defined by the fly-lines 1010 and generate the routed signal bus 1020, providing complete connection of all bits and maintaining substantial regularity of the multi-cluster sections of the signal bus 1020.

Figure 11:
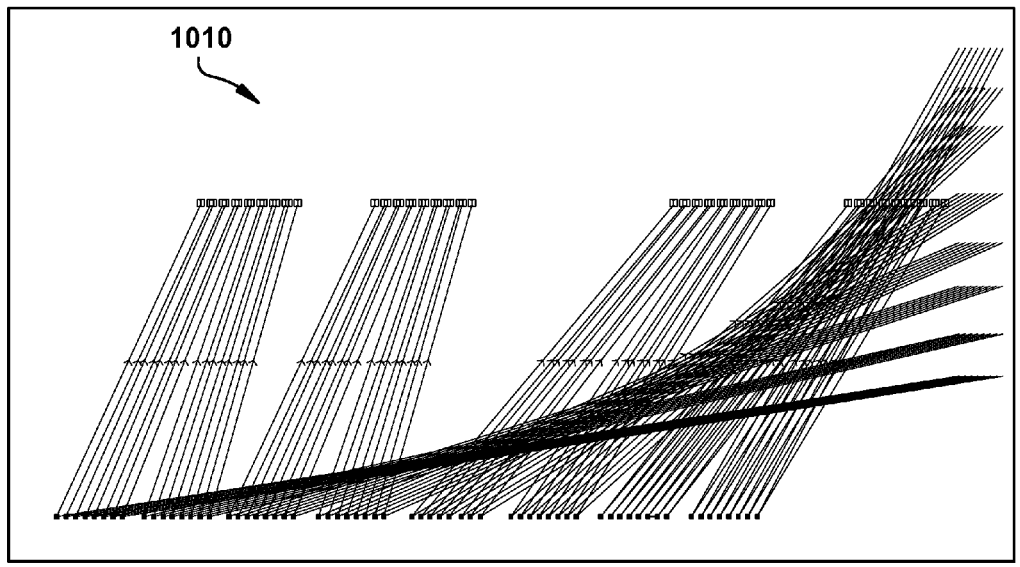
FIG. 11 illustrates another example embodiment of a congested integrated circuit design having a multi-cluster/multi-sink geometry with one driver bank configured to drive two sink banks via one signal bus, where one of the two sink banks is segmented into four sections.
Figure 11:
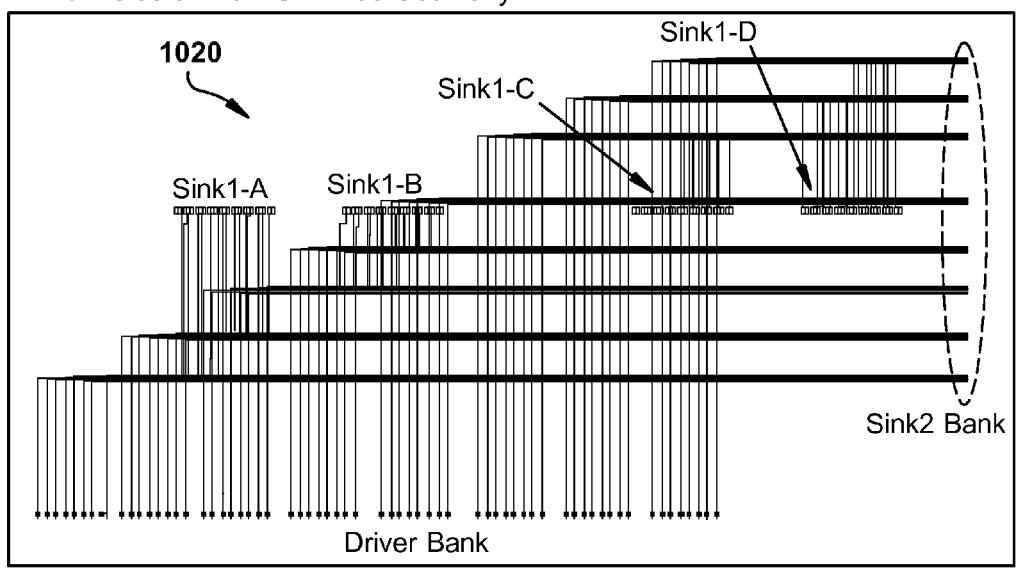

FIG. 11 illustrates another example embodiment of a congested integrated circuit design having a multi-cluster/multi-sink geometry with one driver bank configured to drive two sink banks via one signal bus, where one of the two sink banks is segmented into four sections. The bus routing tool, as disclosed herein, is configured to take the circuit interconnections defined by the fly-lines 1110 and generate the routed signal bus 1120, providing complete connection of all bits and maintaining substantial regularity of the multi-cluster/multi-sink sections of the signal bus 1020.

FIGS. 12-15 illustrates one example embodiment of the process of generating a three-dimensional routing solution graph 1500 having multiple escape nodes defining a routing solution domain between a source location 1210 and a target location 1220 of an integrated circuit design 1200. The example of FIGS. 12-15 is a simple example in the sense that only twelve escape nodes are generated to construct a routing solution graph 1500, and only two metal layers are used (M9 and M10). However, in practice, many hundreds or thousands of escape nodes may be generated when constructing a routing solution graph, and three or more metal layers may be used.

Figure 12:
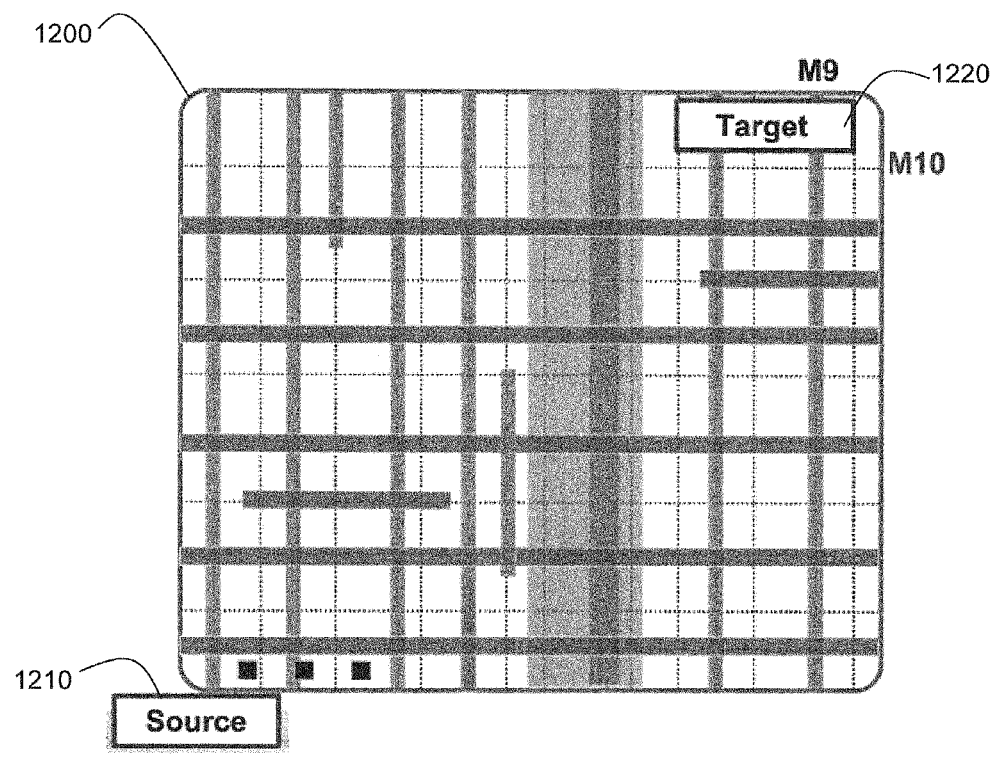
FIGS. 12-15 illustrate one example embodiment of the process of generating a three-dimensional routing solution having multiple escape nodes defining a routing solution domain between a source location and a target location of an integrated circuit design.

Referring to FIG. 12, an integrated circuit design 1200 is depicted showing a source location 1210 and a target location 1220 between which a signal bus is to be routed. The integrated circuit design 1200 may have various blockages/obstacles, reserved spaces, and previously routed signal buses that are to be avoided. Furthermore, the integrated circuit design 1200 has a limited number of available tracks that may be used for placement of the escape nodes. In accordance with one embodiment, the graph construction logic 711 of the bus routing tool 700 is used to construct the routing solution graph 1500 as part of global bus routing 613.

Figure 13:
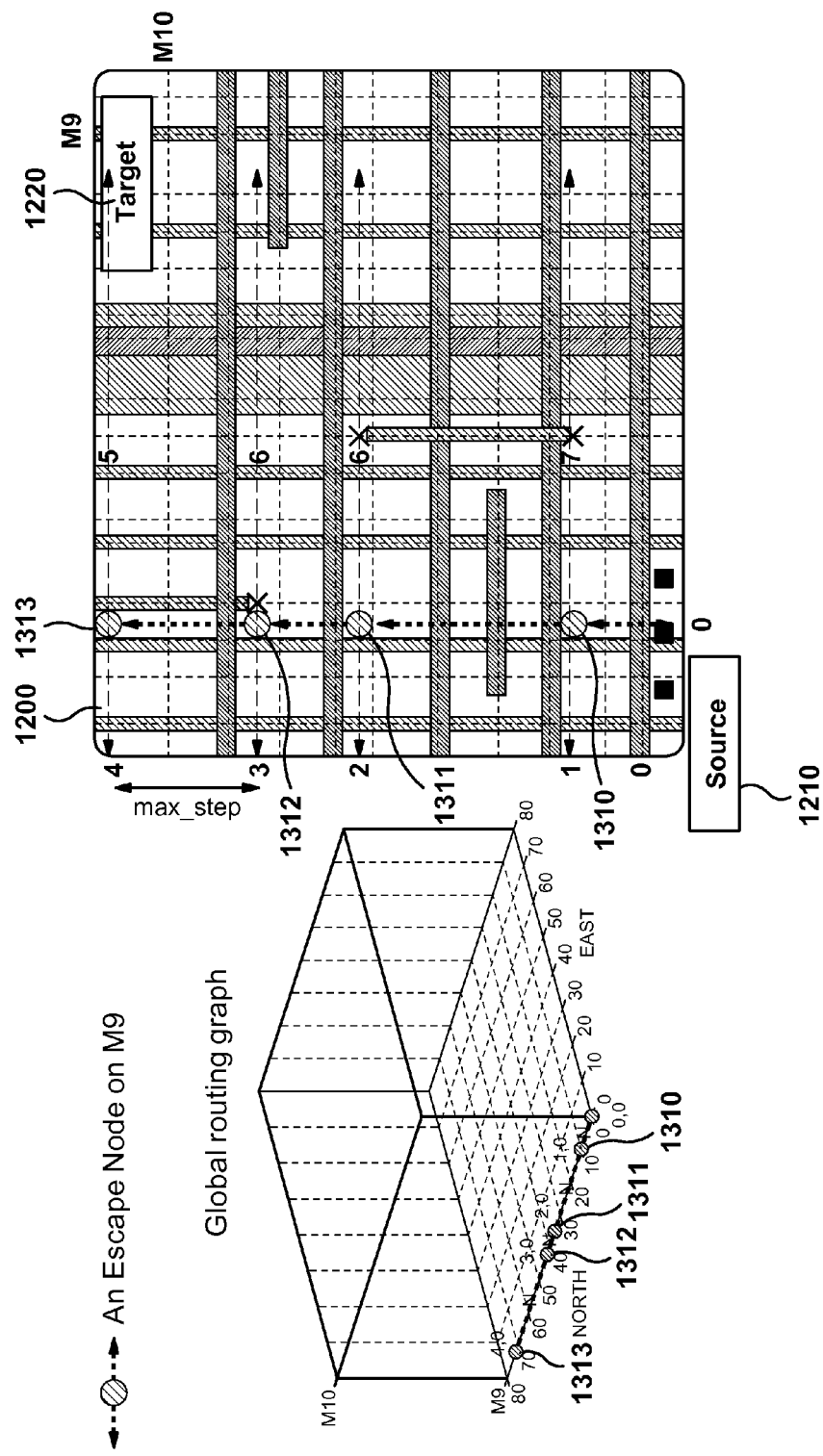

Referring to FIG. 13, the systems and methods disclosed herein generate a root escape node 1310 proximate the source location 1210 on metal layer M9 of the integrated circuit design. Subsequently, various child escape nodes 1311, 1312, and 1313 are generated at various locations along a northerly direction on metal layer M9 as shown in FIG. 13. Blockages and track availability are taken into account when determining escape node placement. It is noted here that the placement of the escape nodes is not limited to any defined grid pattern or structure. Much flexibility exists when placing escape nodes, thus allowing more opportunities to avoid blockages and use available tracks.

Figure 14:
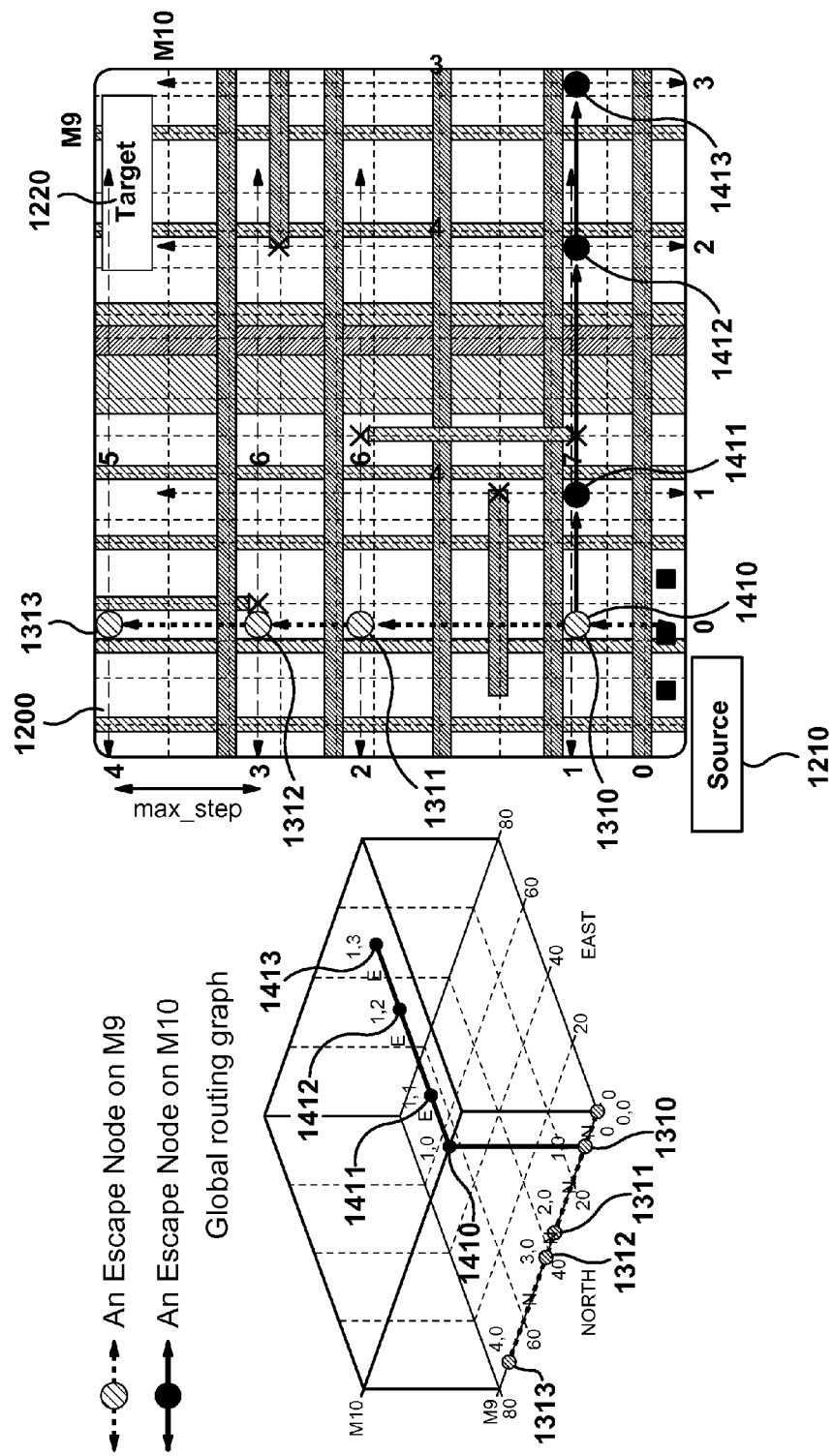
Figure 15:
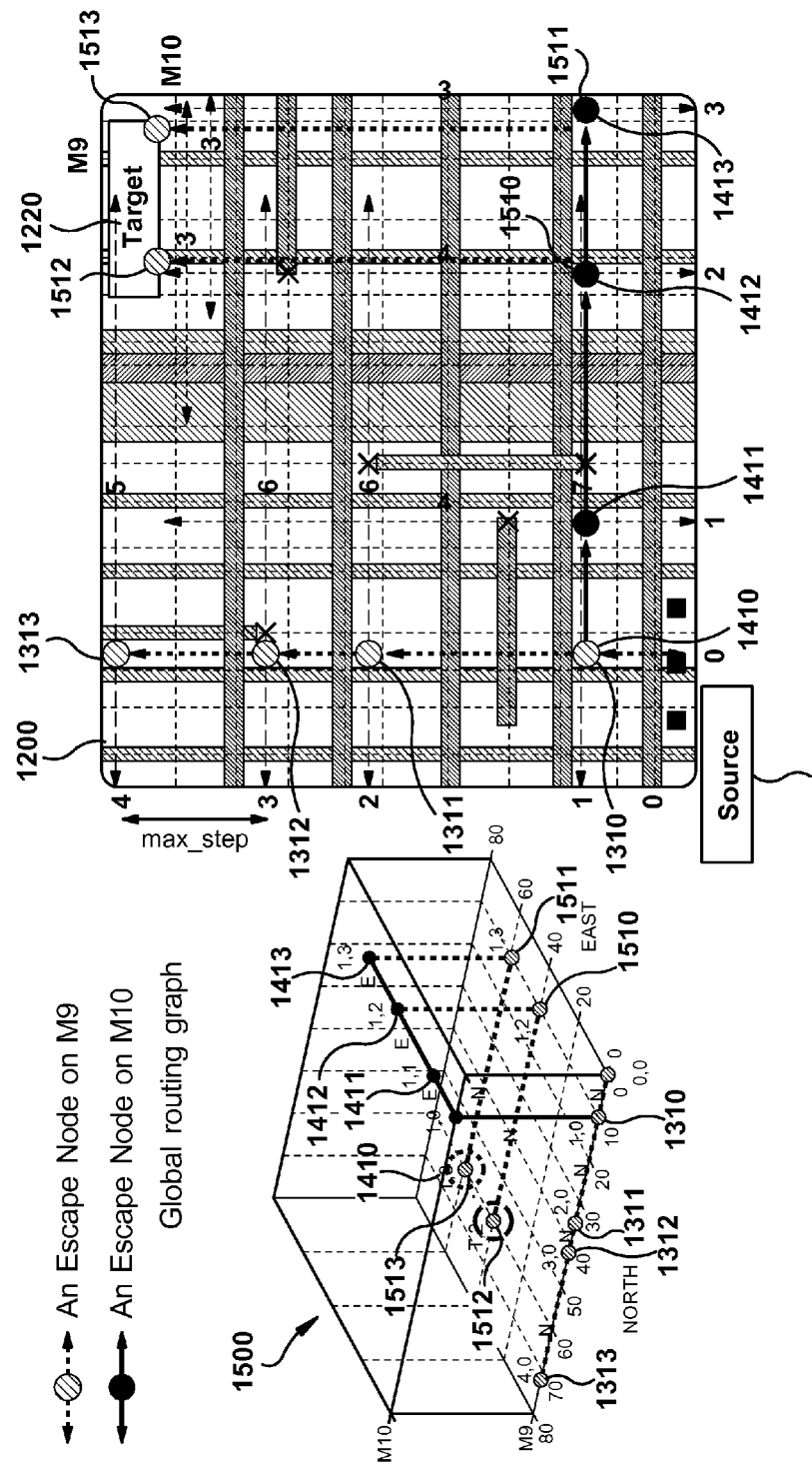

Referring to FIG. 14, the systems and methods disclosed herein further generate various other child escape nodes 1410, 1411, 1412, and 1413 at various locations along an easterly direction on metal layer M10 of the integrated circuit design 1200. Referring to FIG. 15, the systems and methods disclosed herein also generate various other child escape nodes 1510, 1511, 1512, and 1513 at various locations along a northerly direction on metal layer M9, arriving at the target location 1220. Again, blockages and track availability are taken into account when determining escape node placement.

The result is a three-dimensional routing solution graph 1500 providing a routing solution domain of twelve escape nodes between the source location 1210 and the target location of 1220. In accordance with one embodiment, the graph traversal logic 720 of the bus routing tool 700 may then be employed, as part of global bus routing 613, to back traverse through the graph 1500 from one or more escape nodes (e.g., 1512, 1513) proximate the target location 1220 to the root escape node 1310 in an attempt to determine a bus routing solution for the signal bus.

For example, in one embodiment, a first bus routing solution may be determined by back traversing from the leaf escape node 1512 in a southerly direction to escape node 1510 on metal layer M9; then in an upward direction to escape node 1412 on metal layer M10; then in a westerly direction to escape nodes 1411 and 1410 on metal layer M10; then in a downward direction to the root node 1310 on metal layer M9.

Similarly, a second bus routing solution may be determined by back traversing from the leaf escape node 1513 in a southerly direction to escape node 1511 on metal layer M9; then in an upward direction to escape node 1413 on metal layer M10; then in a westerly direction to escape nodes 1412, 1411, and 1410 on metal layer M10; then in a downward direction to the root node 1310 on metal layer M9.

In accordance with one embodiment, the first and second routing solutions may be sorted by the solution sorting logic 730 and the user may select one of the two solutions via user-interactive logic 740, as part of global routing 613. The selected solution may then be forwarded to bit detailing logic 750, as part of detail bus routing 614, where the individual bits of the signal bus for the selected solution are accurately routed by aligning the individual bits to tracks, driver pins, and sink pins in the design space to achieve connectivity.

By constructing a routing solution graph for a signal bus based on escape nodes, where placement of the escape nodes is not restricted by arbitrary grid patterns or pre-set distances between nodes, more robust candidate routing solutions through an integrated circuit design can be found.

Figure 16:
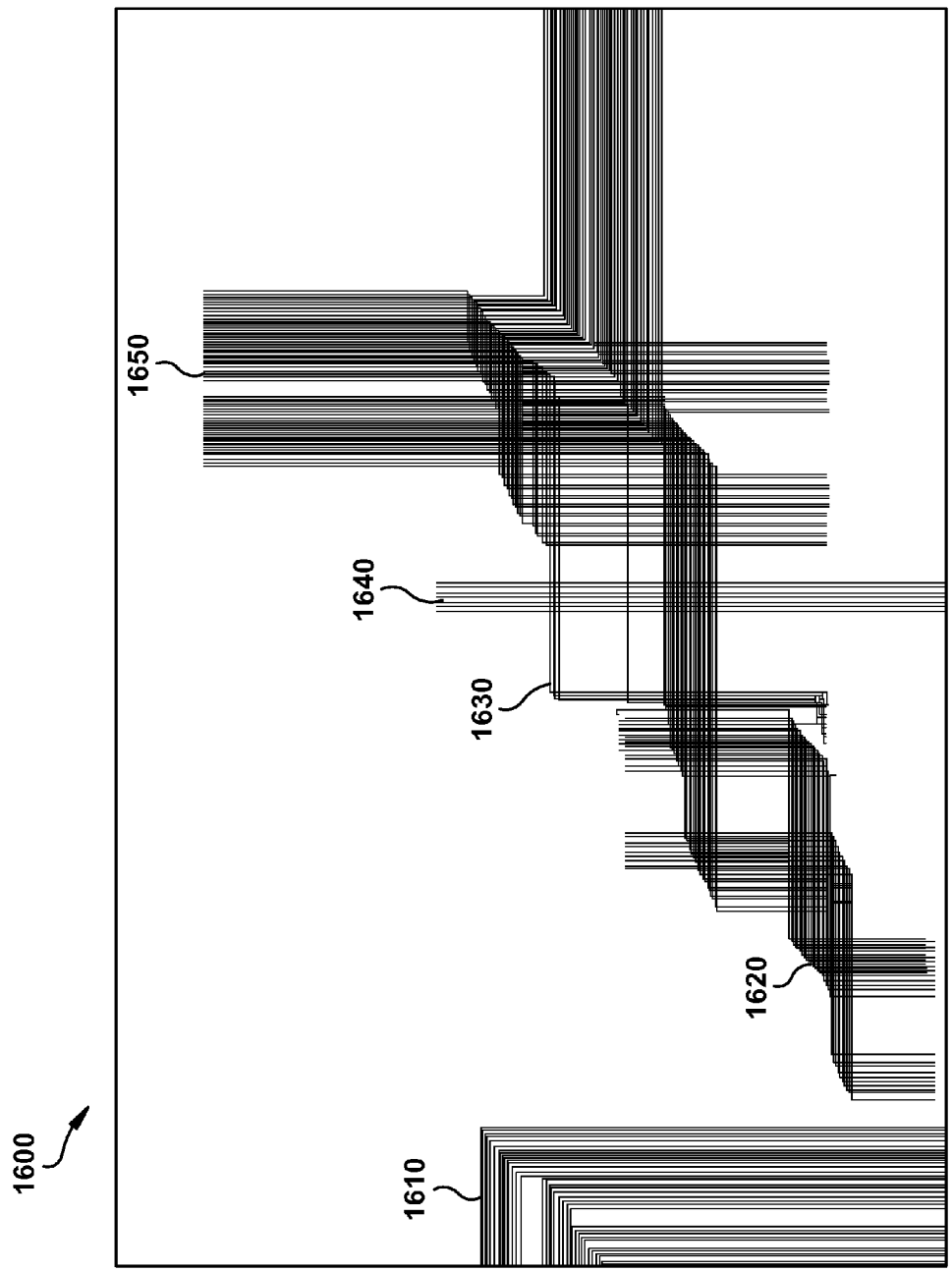
FIG. 16 illustrates an example embodiment of a multiple signal bus structure showing multiple signal buses that have been routed by the bus routing tool of FIG. 7 in a synergistic manner.

FIG. 16 illustrates an example embodiment of a multiple signal bus structure 1600 showing multiple signal buses that have been routed by the bus routing tool 700 in a synergistic manner. The multiple signal bus structure 1600 includes five separate signal buses 1610, 1620, 1630, 1640, and 1650. As shown in FIG. 16, the bus routing tool 700 has successfully routed the multiple signal buses in a tight region within a design space of an integrated circuit design while achieving bus regularity and route legality (no opens and no shorts).

In accordance with one embodiment, multiple buses of a multiple signal bus structure may be routed by the tool 700 strictly in accordance with a defined bus routing order. However, in accordance with another embodiment, the bus routing tool 700 includes logic that implements procedures to automatically re-route a previously routed signal bus. For example, referring to FIG. 17, a previously routed signal bus (e.g., signal bus 1640) may be re-routed if the re-routing helps to achieve routing of a subsequent signal bus (e.g., signal bus 1650) in the defined bus routing order. In this manner, multiple signal buses may be synergistically routed, loosely adhering to the defined bus routing order.

Embodiments of a bus routing tool for automatically routing complex signal buses have been disclosed herein. The bus routing tool is configured to generate a plurality of escape nodes to construct a three-dimensional routing solution graph. A design space of the integrated circuit design is probed by the bus routing tool to dynamically determine a location of each escape node while avoiding path blockages within the design space. By traversing the three-dimensional routing solution graph from a leaf escape node near a target location within the design space back to a root escape node near a source location within the design space, a candidate routing solution for routing a signal bus from the source location to the target location may be determined. The bus routing tool ensures that the routing solution is complete and maintains routing regularity for all of the bits of the signal bus.

Computing Device Embodiment

Figure 17:
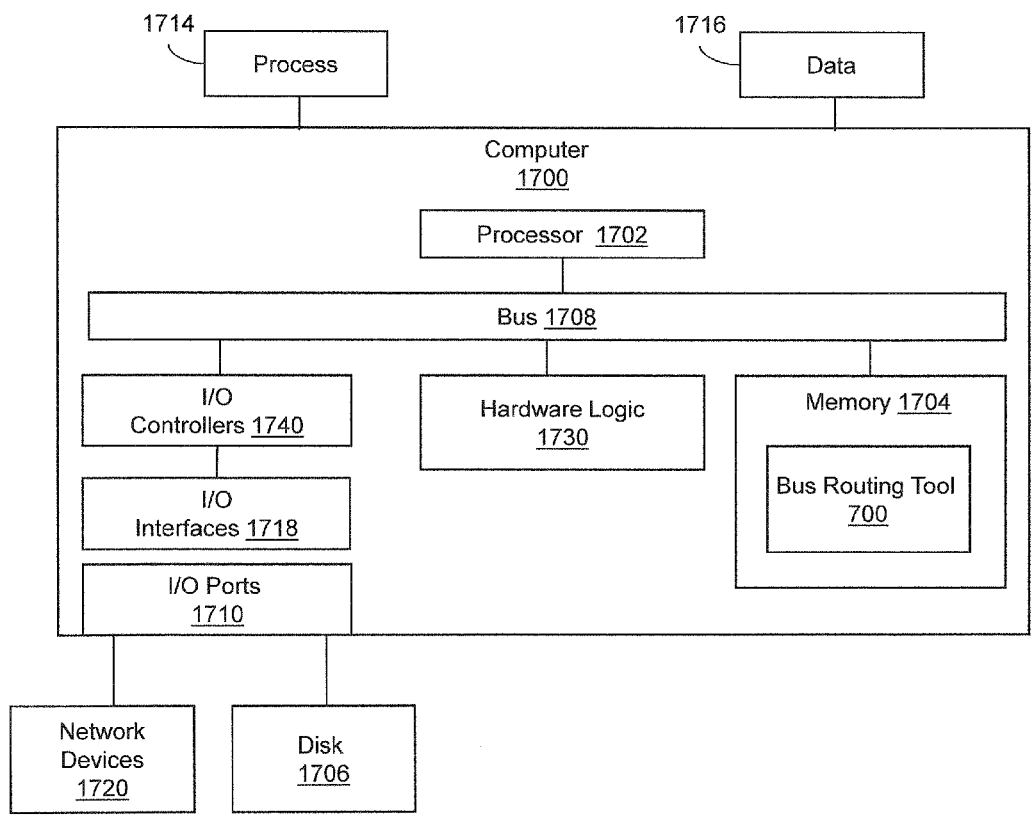
FIG. 17 illustrates one example embodiment of a computing device upon which an embodiment of a bus routing tool may be implemented.

FIG. 17 illustrates an example embodiment of a computing device that is configured and/or programmed with one or more of the example systems and methods described herein, and/or equivalents. The example computing device may be a computer 1700 that includes at least a processor 1702, a memory 1704, and input/output ports 1710 operably connected by a bus 1708. In one example, the computer 1700 may include the bus routing tool 700 configured to automatically generate bus routing solutions for an integrated circuit design represented on the computer 1700, allowing for the complete routing of signal buses while maintaining regularity of the signal buses.

In accordance with one embodiment, the bus routing tool 700 is configured as computer-readable instructions (as an algorithm) stored in the memory 1704 which may communicate to the bus 1708 such that the processor 1702 may read in and execute the instructions. However, it is to be understood that, in different embodiments, the bus routing tool 700 may be implemented in hardware (e.g., as hardware logic 1730 connected to the bus 1708), a non-transitory computer-readable medium with stored instructions, firmware, and/or combinations of both.

In one embodiment, logic 1730 or the computer is a means (e.g., structure: hardware, non-transitory computer-readable medium, firmware) for performing the actions described. For example, Logic 1730 may provide means (e.g., hardware, non-transitory computer-readable medium that stores executable instructions, firmware) for performing bus routing. In some embodiments, the computing device may be a server operating in a cloud computing system, a server configured in a Software as a Service (SaaS) architecture, a smart phone, laptop, tablet computing device, and so on).

The means may be implemented, for example, as an ASIC programmed to automatically generate bus routing solutions for an integrated circuit design by constructing a three-dimensional routing solution graph and by traversing paths of escape nodes through the graph from a target location to a source location within a design space of the integrated circuit design. The means may also be implemented as stored computer executable instructions that are presented to computer 1700 as data 1716 that are temporarily stored in memory 1704 and then executed by processor 1702.

Generally describing an example configuration of the computer 1700, the processor 1702 may be a variety of various processors including dual microprocessor and other multiprocessor architectures. A memory 1704 may include volatile memory and/or non-volatile memory. Non-volatile memory may include, for example, ROM, PROM, and so on. Volatile memory may include, for example, RAM, SRAM, DRAM, and so on.

A storage disk 1706 may be operably connected to the computer 1700 via, for example, an input/output interface (e.g., card, device) 1718 and an input/output port 1710. The disk 1706 may be, for example, a magnetic disk drive, a solid state disk drive, a floppy disk drive, a tape drive, a Zip drive, a flash memory card, a memory stick, and so on. Furthermore, the disk 1706 may be a CD-ROM drive, a CD-R drive, a CD-RW drive, a DVD ROM, and so on. The memory 1704 can store a process 1714 and/or a data 1716, for example. The disk 1706 and/or the memory 1704 can store an operating system that controls and allocates resources of the computer 1700.

The computer 1700 may interact with input/output devices via the I/O interfaces 1718 and the input/output ports 1710. Input/output devices may be, for example, a keyboard, a microphone, a pointing and selection device, cameras, video cards, displays, the disk 1706, the network devices 1720, and so on. The input/output ports 1710 may include, for example, serial ports, parallel ports, and USB ports.

The computer 1700 can operate in a network environment and thus may be connected to the network devices 1720 via the I/O interfaces 1718, and/or the I/O ports 1710. Through the network devices 1720, the computer 1700 may interact with a network. Through the network, the computer 1700 may be logically connected to remote computers. Networks with which the computer 1700 may interact include, but are not limited to, a LAN, a WAN, and other networks.

DEFINITIONS AND OTHER EMBODIMENTS

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on). In one embodiment, a computing device is implemented with one or more executable algorithms that are configured to perform any of the disclosed methods.

In one or more embodiments, the disclosed methods or their equivalents are performed by either: computer hardware configured to perform the disclosed methods; or computer instructions embodied in a non-transitory computer-readable medium including an executable algorithm configured to perform the disclosed methods.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium" or "computer storage medium", as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C §101.

"Logic", as used herein, represents a component that is implemented with computer or electrical hardware, firmware, a non-transitory medium with stored instructions of an executable application or program module, and/or combinations of these to perform any of the functions or actions as disclosed herein, and/or to cause a function or action from another logic, method, and/or system to be performed as disclosed herein. Logic may include a microprocessor programmed with an algorithm, a discrete logic (e.g., ASIC), at least one circuit, an analog circuit, a digital circuit, a programmed logic device, a memory device containing instructions of an algorithm, and so on, any of which are configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. Logic is limited to statutory subject matter under 35 U.S.C. §101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

A "data structure", as used herein, is an organization of data in a computer where the organization of the data is such that the data can be used efficiently. A data structure may be any one of, for example, a data file, a data array, a data record(s), a data table, a graph, or a tree etc. Other examples of data structures are possible as well, in accordance with other embodiments.

"User", as used herein, includes but is not limited to one or more persons, computers or other devices, or combinations of these.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A computer-implemented method comprising:
determining at least one candidate routing solution for routing a signal bus from a source location to a target location in a design space of an integrated circuit design representing an integrated circuit by:
(i) generating, by a bus routing tool, a plurality of nodes having defined design space properties, starting with a root node proximate the source location and recursively expanding toward the target location, to construct a three-dimensional routing solution graph comprising the plurality of nodes and defining a routing solution domain between the source location and the target location; and
(ii) traversing at least one path of nodes, by the bus routing tool, through the three-dimensional routing solution graph from at least one node of the plurality of nodes, which is proximate the target location, back to the root node, wherein the at least one path of nodes defines the at least one candidate routing solution.

2. The computer-implemented method of claim 1, further comprising constructing, by the bus routing tool, the three-dimensional routing solution graph by probing the design space in a directed manner toward the target location to dynamically determine a location, independent of a defined grid pattern, of each node of the plurality of nodes that avoids path blockages within the design space.

3. The computer-implemented method of claim 1, further comprising determining, by the bus routing tool, the at least one candidate routing solution automatically without user intervention.

4. The computer-implemented method of claim 1, further comprising automatically sorting, by the bus routing tool, a plurality of candidate routing solutions for the signal bus generated by the bus routing tool based on user-set priority criteria.

5. The computer-implemented method of claim 1, further comprising reading, by the bus routing tool, a computer representation of the integrated circuit design.

6. The computer-implemented method of claim 5, wherein the computer representation of the integrated circuit design comprises:
(i) congestion map data defining potential path blockages within the design space of the integrated circuit design;
(ii) net list data defining electrical connections that are to be completed between the source location and the target location by the signal bus; and
(iii) user-set options.

7. The computer-implemented method of claim 1, further comprising exporting, by the bus routing tool, the at least one candidate routing solution to at least one data structure.

8. The computer-implemented method of claim 1, further comprising constructing, by the bus routing tool, the three-dimensional routing solution graph via, at least in part, a combination of an anchor-based street and traffic aware routing technique and a line search routing technique.

9. The computer-implemented method of claim 1, further comprising ensuring, by the bus routing tool, that the at least one routing solution maintains a routing regularity of a plurality of bits of the signal bus from the source location to the target location.

10. A computing system, comprising:
a graph construction logic configured to construct a three-dimensional routing solution graph, comprising a plurality of nodes having defined design space properties and defining a routing solution domain between a source location and a target location in a design space of an integrated circuit design, by:
(i) generating a root node of the plurality of nodes which is proximate the source location, and
(ii) recursively expanding toward the target location to generate additional nodes of the plurality of nodes; and
a graph traversal logic configured to:
(i) traverse at least one path of nodes through the three-dimensional routing solution graph from at least one node of the plurality of nodes, which is proximate the target location, back to the root node, and
(ii) output at least one candidate bus routing solution, based on the at least one path of nodes, for routing a signal bus from the source location to the target location.

11. The computing system of claim 10, further comprising a solution sorting logic configured to sort a plurality of candidate routing solutions for routing the signal bus based on user-set priority criteria, wherein the plurality of candidate routing solutions are output by the graph traversal logic.

12. The computing system of claim 10, further comprising a user interactive logic configured to (i) receive user input information and (ii) based at least in part on the user input information, select one candidate routing solution from a plurality of candidate routing solutions for routing the signal bus, wherein the plurality of candidate routing solutions are output by the graph traversal logic.

13. The computing system of claim 10, wherein the graph construction logic includes a probing logic configured to probe the design space in a guided manner to dynamically determine a location of each node of the plurality of nodes that avoids path blockages within the design space.

14. The computing system of claim 10 further comprising:
a memory; and
a processor connected to the memory,
wherein the graph construction logic and the graph traversal logic each include at least one module stored in the memory including instructions executable by the processor that, when executed, cause at least the processor to perform the generating, the recursively expanding, the traverse at least one path of nodes, and the output at least one candidate bus routing solution.

15. A non-transitory computer-readable medium storing instructions that, when executed by one or more processors of a computing device, cause the computing device to at least:
generate a plurality of nodes, having defined design space properties, to construct a three-dimensional bus routing solution for a signal bus by automatically probing a design space of an integrated circuit design to dynamically determine a location of each node of the plurality of nodes that avoids path blockages within the design space; and
determine at least one candidate routing solution for routing the signal bus from a source location to a target location in the design space by automatically traversing at least one path of nodes through the three-dimensional bus routing solution from at least one leaf node proximate the target location back to a root node proximate the source location.

16. The non-transitory computer-readable medium of claim 15, wherein the instructions further comprise instructions that, when executed by the one or more processors, cause the computing device to automatically sort a plurality of candidate routing solutions for the signal bus based on user-set priority criteria.

17. The non-transitory computer-readable medium of claim 15, wherein the instructions further comprise instructions that, when executed by the one or more processors, cause the computing device to read user input information and select one candidate routing solution from a plurality of candidate routing solutions for the signal bus based at least in part on the user input information.

18. The non-transitory computer-readable medium of claim 15, wherein the instructions further comprise instructions that, when executed by the one or more processors, cause the computing device to read a congestion map defining potential path blockages within the design space of the integrated circuit design.

19. The non-transitory computer-readable medium of claim 15, wherein the instructions further comprise instructions that, when executed by the one or more processors, cause the computing device to read a net list defining electrical connections between the source location and the target location that are to be completed by the signal bus.

20. The non-transitory computer-readable medium of claim 15, wherein the instructions further comprise instructions that, when executed by the one or more processors, cause the computing device to provide a selectable combination of user-guided bus routing and bus routing automation.

* * * * *